(12) United States Patent
Nishiyama et al.

(10) Patent No.: US 7,947,365 B2
(45) Date of Patent: May 24, 2011

(54) MESOPOROUS THIN FILM AND METHOD OF PRODUCING THE SAME

(75) Inventors: Norikazu Nishiyama, Osaka (JP); Masaki Takaoka, Kyoto (JP); Akira Kamisawa, Kyoto (JP)

(73) Assignees: Rohm Co., Ltd., Kyoto (JP); Osaka University, Osaka (JP)

( * ) Notice: Subject to any disclaimer, the term of this patent is extended or adjusted under 35 U.S.C. 154(b) by 760 days.

(21) Appl. No.: 11/666,138

(22) PCT Filed: Oct. 20, 2005

(86) PCT No.: PCT/JP2005/019323
§ 371 (c)(1),
(2), (4) Date: Dec. 3, 2007

(87) PCT Pub. No.: WO2006/043640
PCT Pub. Date: Apr. 27, 2006

(65) Prior Publication Data
US 2009/0039346 A1   Feb. 12, 2009

(30) Foreign Application Priority Data
Oct. 22, 2004  (JP) .............................. P.2004-308732

(51) Int. Cl.
*B32B 3/26* (2006.01)
(52) U.S. Cl. ............... 428/314.2; 428/312.2; 428/312.8; 428/315.7; 428/704
(58) Field of Classification Search .................. None
See application file for complete search history.

(56) References Cited

U.S. PATENT DOCUMENTS
2006/0049101 A1 * 3/2006 Suib et al. ................ 210/500.21

FOREIGN PATENT DOCUMENTS
| | | | |
|---|---|---|---|
| FR | 2819431 | * | 7/2002 |
| JP | 2003-17482 | | 1/2003 |
| JP | 2004-225113 | | 8/2004 |
| JP | 2004-256344 | | 9/2004 |
| JP | 2004256344 A | * | 9/2004 |

OTHER PUBLICATIONS

Translation of JP-2004256344.*
Translation of FR-2819431.*
Fan, et al., "Ordered, Nanostructured Tin-Based Oxides/Carbon Composite as the Negative-Electrode Material for Lithium-Ion Batteries", Adv. Mater., 2004, 16, No. 16, pp. 1432-1737.
Ying, et al., "Synthesis and Applications of Supramolecular-Templated Mesoporous Materials", Angew. Chem. Int. Ed. 1999, 38, pp. 57-77.

* cited by examiner

*Primary Examiner* — Ling Xu
(74) *Attorney, Agent, or Firm* — Hamre, Schumann, Mueller & Larson, P.C.

(57) ABSTRACT

An electroconductive porous film high in the porosity and strong in the mechanical strength is provided.
A mesoporous thin film of the invention, in which a crosslinking structure having a metal phosphate ($M-PO_x$) skeleton is arranged so as to surround periodically arranged pores, is formed by use of a process that includes: a step of preparing a precursor solution containing phosphoric acid and a surfactant; a step of supplying the precursor solution to a substrate to form a precursor thin film; a step of bringing vapor containing a metal into contact with the precursor thin film obtained in the forming the thin film; a step of reacting the vapor containing a metal and phosphoric acid to form a self-organized thin film; and a step of removing the surfactant from the self-organized thin film.

5 Claims, 11 Drawing Sheets

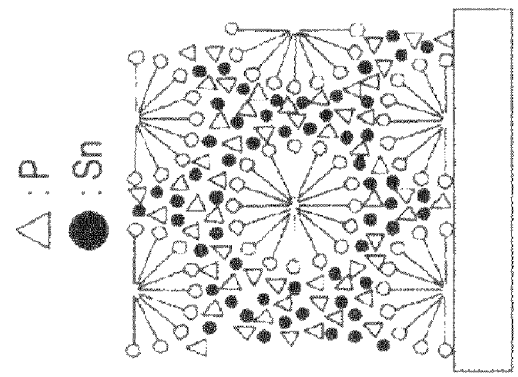
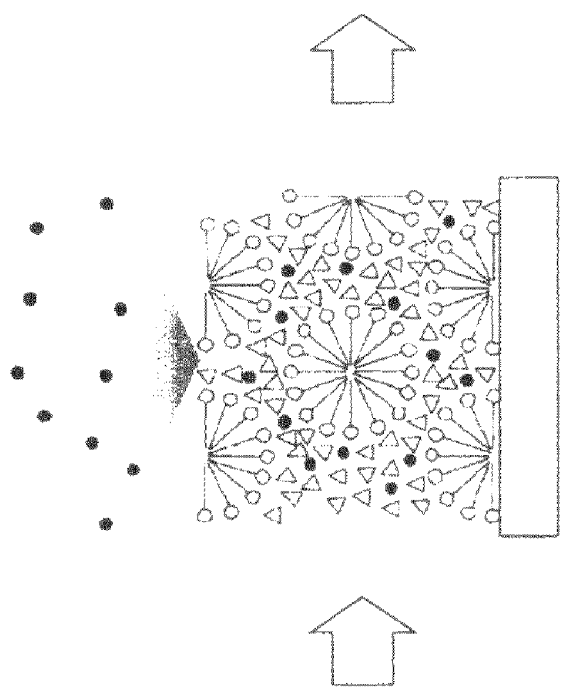
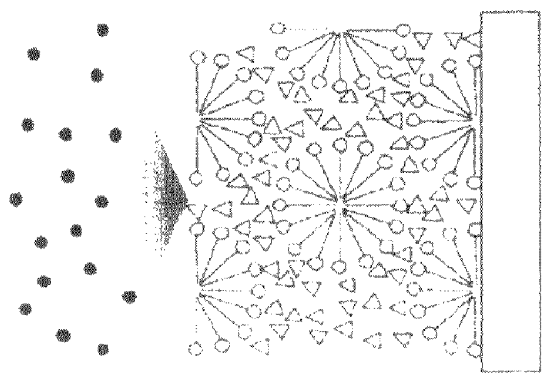
FIG. 4 (a)  FIG. 4 (b)  FIG. 4 (c)
△: P
●: Sn

MESOPOROUS THIN FILM AND METHOD OF PRODUCING THE SAME

TECHNICAL FIELD

The invention relates to a mesoporous thin film, an electronic device therewith and a method of producing the same, in particular, an electroconductive thin film of a periodic nanoporous structure.

BACKGROUND ART

So far, as electroconductive porous materials, carbon porous bodies and metal oxide porous bodies, which have a aperiodic porous structure, are proposed. Among these, electroconductive oxides such as metal oxide porous bodies, by making use of the electrical characteristics thereof, are at present in wide use as gas sensors and the like. Furthermore, tin oxide ($SnO_2$), indium oxide (ITO) and the like, which are transparent electroconductive oxides, because of the electrical characteristics and optical characteristics thereof, are widely adopted in many fields such as electrodes, selective transmission films and heat reflective films of electronic devices such as solar batteries and EL elements, and electroconductive films for touch panels and the like.

Furthermore, as an oxide having a periodical porous structure, an insulating film that has silica as a skeleton is as well proposed (JP-A No. 2003-17482). The insulating film, having a periodical nanoporous structure, in spite of being high in the porosity, can maintain sufficient mechanical strength; accordingly, it is in wide use as interlayer insulating films of semiconductor devices. In order to achieve high-speed and lower power consumption operation of semiconductor devices, it is very important to make the dielectric constant of the interlayer insulating film lower.

In the case of the aperiodic porous structure, the safety is not sufficient; accordingly, in order to achieve further safety, heat resistance and porosity, various researches are conducted.

Still furthermore, in the former case, since porous structures are formed at random, the mechanical strength is not sufficient; accordingly, when it is used under high temperature in particular, damage tends to be caused and the reliability is deteriorated.

Furthermore, in many cases, the porous structures are not closed. When the porous structure is not closed, the moisture resistance of the film is remarkably deteriorated, resulting in deterioration of the reliability of the semiconductor device.

SUMMARY

Thus, in the existing metal oxide porous bodies, there are problems in that not only the heat resistance, porosity and chemical stability cannot be sufficiently obtained but also the mechanical strength is not sufficient.

The invention is carried out in view of the circumstances and intends to provide an electroconductive porous film high in the porosity and strong in the mechanical strength.

Means for Solving the Problems

In this connection, in a mesoporous thin film of the invention, a crosslinking structure that has a metal phosphate ($M-PO_x$) skeleton is formed so as to surround periodically arranged pores.

According to such a configuration, owing to a periodic porous structure, the mechanical strength can be heightened and an electroconductive thin film can be obtained.

In the mesoporous thin film of the invention, a metal that constitutes the crosslinking structure contains at least one of tin (Sn), indium (In), zinc (Zn) and iridium (Ir).

According to such a configuration, an electroconductive porous thin film can be obtained.

In the mesoporous thin film of the invention, the crosslinking structure includes one where cylindrical columnar pores are periodically arranged along a thickness direction of the mesoporous thin film.

According to such a configuration, grain boundaries are formed along a thickness direction of the film; accordingly, the irregular reflection can be inhibited from occurring.

Furthermore, the mesoporous thin film of the invention includes one of which film thickness is 10 µm or less.

According to such a configuration, a high definition pattern can be formed.

The mesoporous thin film of the invention includes one that is translucent.

According to such a configuration, a translucent and electroconductive porous thin film can be obtained.

Furthermore, an electronic device uses the mesoporous thin film as an electrode.

According to such a configuration, an electroconductive thin film high in the translucency can be obtained under low temperatures; accordingly, the mesoporous thin film is very effective as a translucent electrode of a solar battery, optical sensor, EL element or the like.

Furthermore, a method of the invention includes: a step of preparing a precursor solution containing phosphoric acid and a surfactant; a step of supplying the precursor solution to a substrate to form a precursor thin film; a step of bringing a vapor containing a metal into contact with the precursor thin film obtained in forming the thin film; a step of reacting the vapor containing a metal and phosphoric acid to form a self-organized thin film; and a step of removing the surfactant from the self-organized thin film to form a mesoporous thin film that has a crosslinking structure having a metal phosphate ($M-PO_x$) skeleton as a main component and periodically arranged pores.

According to such a configuration, a porous electroconductive thin film excellent in the mechanical strength can be provided with excellent controllability. Furthermore, an electroconductive film that has at least two kinds of different periodic structures such as an electroconductive thin film where a first porous structural domain layer where tubular pores are periodically arranged and a second porous structural domain layer where lamellar pores are periodically arranged in parallel with a surface of the substrate are repeatedly laminated in parallel with a surface of the substrate and the like can be readily formed.

Furthermore, the mesoporous thin film can be formed under low temperatures; accordingly, even when it is applied to an integrated circuit, without adversely affecting on an undercoat, an electroconductive thin film high in the reliability can be formed. The mesoporous thin film, being capable of forming without undergoing a heating process of 500° C. or more, can be applied even when an aluminum wiring is used.

Still furthermore, since the mesoporous thin film can be formed due to a contact with a liquid, even in a fine region, a high definition pattern can be formed and thereby the reliability can be improved.

Still furthermore, since, when a concentration of the precursor solution is controlled, the porosity can be appropriately varied, a porous thin film having desired electroconductivity can be formed with excellent workability.

Furthermore, in the method of the invention, the step of bringing into contact includes a step of standing still the precursor thin film in a container filled with vapor containing a metal.

According to such a configuration, only by standing still, with excellent productivity, electroconductive porous thin films can be formed.

Furthermore, in the method of the invention, the step of removing includes a step of calcining the crosslinking structure to remove the surfactant.

According to such a configuration, the surfactant can be efficiently removed to form a crosslinking structure having regularly arranged fine pores.

In the method of the invention, the step of removing includes a step of calcining at a temperature in the range of substantially 300 to 550° C.

According to such a configuration, the mesoporous thin film, being capable of calcining under low temperatures, even when an undercoat layer includes an aluminum wiring, can be applied.

The method of the invention includes a step of exposing a substrate to which the precursor solution is supplied to the vapor containing a metal to densify a metal-phosphoric acid skeleton, preceding the step of removing the surfactant.

According to such a configuration, the density can be readily controlled.

Furthermore, in the method of the invention, the step of removing includes a step of extracting the surfactant with acid.

According to such a configuration, the mesoporous thin film, being capable of forming without undergoing the step of calcining, can be formed under low temperatures more than ever.

Furthermore, the method of the invention further includes a step of exposing a substrate to which the precursor solution is supplied to the vapor containing a metal to densify a metal-phosphoric acid skeleton, preceding the step of extracting with an acid.

According to such a configuration, the density can be readily delicately controlled.

Furthermore, in the method of the invention, the metal contains at least one of tin (Sn), indium (In), zinc (Zn) and iridium (Ir).

According to such a configuration, a porous electroconductive thin film high in the reliability can be formed.

Still furthermore, the method of the invention includes a step of preparing a precursor solution containing cetyltrimethylammonium bromide ($C_{16}TAB$), phosphoric acid ($H_3PO_4$), ethanol (EtOH) and water; a step of coating the precursor solution on a substrate; a step of exposing the thin film described in the coating to a vapor containing tin chloride ($SnCl_4$); and a step of calcining the thin film to remove the surfactant from the thin film to form a crosslinking structure that has a tin-phosphoric acid skeleton.

According to such a configuration, a porous electroconductive thin film high in the reliability can be formed.

Furthermore, desirably, the step of bringing into contact may include a step of immersing a substrate in the first precursor solution and pulling up at a desired speed and a step of immersing in the second precursor solution and pulling up at a desired speed.

Still furthermore, desirably, the step of bringing into contact may include a step of repeatedly coating the first and second precursor solutions sequentially on the substrate.

Thereby, a porous thin film having a plurality of layers different in the periodical structure can be readily formed.

Furthermore, desirably, the step of bringing into contact may include a step of dropping the precursor solution on the substrate followed by rotating the substrate to apply rotation coating.

According to such a configuration, a film thickness and the porosity can be readily controlled and thereby porous thin films can be formed with excellent productivity.

BRIEF DESCRIPTION OF THE DRAWINGS

FIG. 4 is a schematic diagram showing a production process of the mesoporous thin film.

DETAILED DESCRIPTION

In what follows, embodiments of the invention will be detailed with reference to the drawings.

Embodiment 1

As an embodiment 1 of the invention, a solar battery cell where the electroconductive thin film is used as a translucent electroconductive thin film will be described.

Figure 1:
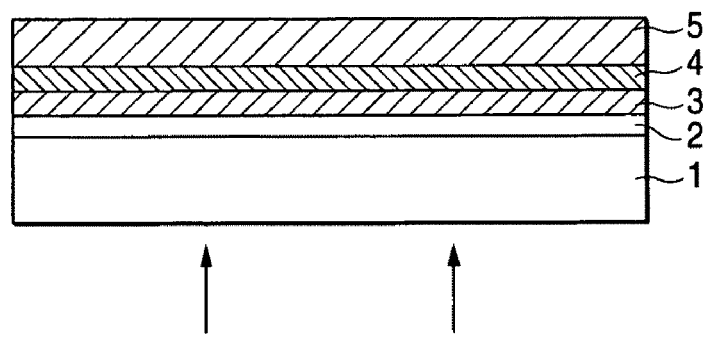
FIG. 1 is a diagram showing a solar battery cell that uses a mesoporous thin film according to an embodiment 1 of the invention.

The solar battery cell includes, as shown in FIG. 1, a translucent electrode 2 made of tin phosphate thin film having a periodical structure (mesoporous thin film), which is formed on a translucent glass substrate 1; a P-type amorphous silicon layer 3 formed thereon; a N-type amorphous silicon layer 4 formed further thereon; and a metal electrode 5 formed further thereon as an aluminum current collecting electrode. Here, between the P-type amorphous silicon layer 3 and the N-type amorphous silicon layer 4, a I layer may be interposed.

The translucent electrode 2 is constituted of a mesoporous thin film in which tubular pores are periodically arranged along a thickness direction and can inhibit the irregular reflection from occurring; accordingly, there is no need of separately forming an anti-reflection layer. As the result, the optical absorptance can be heightened and thereby a solar battery cell high in the photoelectric conversion efficiency can be formed.

Other portions are omitted from illustrating and describing. However, the other portions have standard structures.

Figure 2:
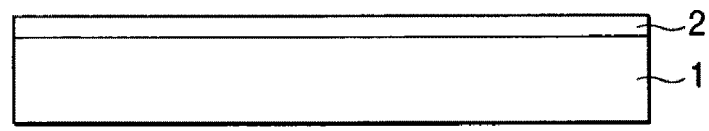
FIG. 2 is a production process chart of the solar battery cell.
Figure 2:
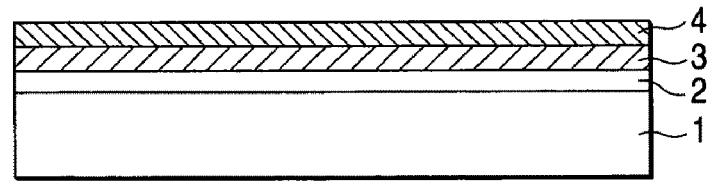
Figure 2:
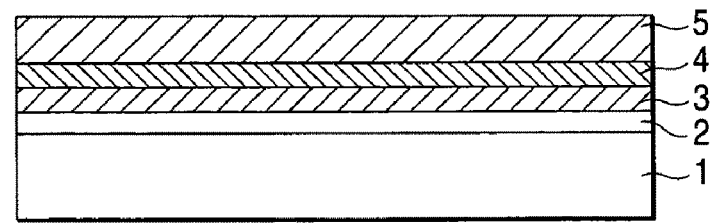

In FIGS. 2(a) to 2(c), a method of forming a solar battery cell, which includes forming a mesoporous thin film, is described.

In the first place, as shown in FIG. 2(a), on a surface of a translucent glass substrate 1, a mesoporous thin film of the invention is formed. micelle structure in which a plurality of molecules with $C_{16}H_{33}N^+ (CH_3)Br^-$ as one molecule aggregates.

Figure 3:
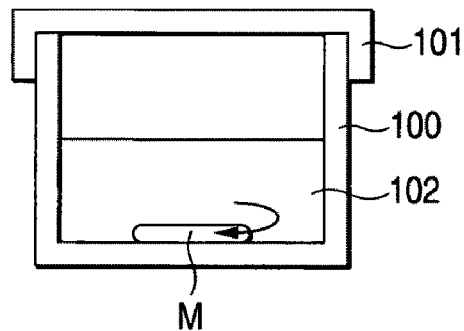
FIG. 3 is a production process chart of the mesoporous thin film.
Figure 3:
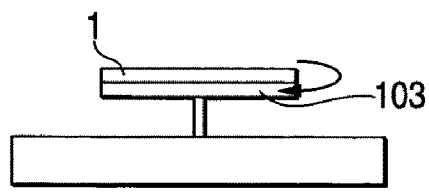
Figure 3:
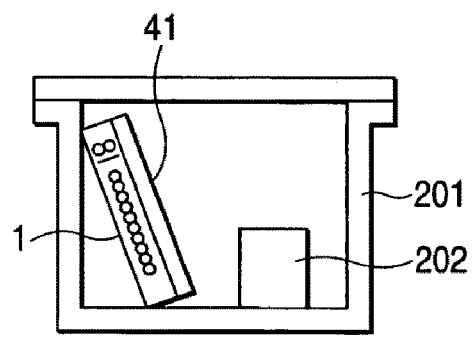
Figure 3:
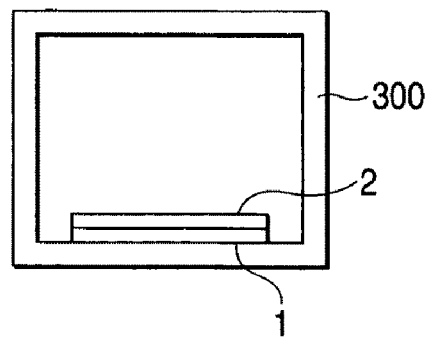

After thus heat treating for 21 hr, as shown in FIG. 3(c), the self-organization is caused.

Then, when the surfactant is removed by calcining at a temperature in the range of 523 to 823K, as shown in FIG. 3(d), a translucent electrode 2 made of a porous electroconductive thin film (mesoporous thin film) in which a lot of pores is periodically arranged is formed. A film thickness of the mesoporous thin film is in the range of 100 to 300 nm, a repeating width of the periodic structure is substantially 4 nm and a pore diameter is 3 nm. The impedance is measured and the conductivity is found to be 46.2 S/cm ($1.0 \times 10^5$ Hz).

Thereafter, as shown in FIG. 2(b), according to a usual method, a PN junction is formed. Here, by means of the reduced pressure CVD method, a P-type amorphous silicon layer 3 and a N-type amorphous silicon layer 4 are sequentially formed. In this case, in pores of the mesoporous thin film as a translucent electrode, the P-type amorphous silicon layer 3 is formed to be advantageously larger in an area of an interface with the N-type amorphous silicon layer 4 formed on the P-type amorphous silicon layer 3. In place of the reduced pressure CVD method, That is, in a vessel 100, firstly, a cationic cetyltrimethylammonium bromide (CTAB: $C_{16}H_{33}N^+ (CH_3)_3$) as a surfactant, phosphoric acid ($H_3PO_4$), ethanol (EtOH) and water ($H_2O$) are charged so that a solution ratio may be $C_{16}TAB: H_3PO_4$: EtOH: $H_2O=0.75:1.5:50:100$, followed by covering with a cover 101, further followed by mixing, still further followed by, as shown in FIG. 3(a), agitating with a magnetic stirrer M for 10 min, and thereby a precursor solution 102 is prepared.

The solution is dropped on a translucent glass substrate set on a spinner 103, followed by, as shown in FIG. 3(b), applying spin coating. At first, the spinner is rotated at 50 rpm for 10 sec, followed by gradually increasing the number of revolution, further followed by rotating at 4000 rpm for 60 sec. Thereafter, as shown in FIG. 3(c) and FIG. 4, in a closed vessel 200, as a skeleton source, $SnCl_{14} \cdot 5H_2O$ is disposed, the glass substrate 1 on which a coated film 41 is formed is disposed, followed by charging vapor particles 42 of $SnCl_{14} \cdot 5H_2O$ that is a skeleton source in the coated film 41, further followed by heat treating at 363K for 21 hr (Vapor Infiltration (VI) process). A state of vapor infiltration at this time is schematically shown in FIG. 4. In the drawings, a Δ mark denotes P and a black mark denotes Sn. The precursor solution forms a periodic self-aggregate of the surfactant. That is, the self-aggregate, as shown in FIG. 4, forms a spherical a plasma CVD method may be used.

Subsequently, as shown in FIG. 2(c), on the top layer, an aluminum thin film is formed as a metal electrode 5.

Thus, a solar battery cell where an electroconductive mesoporous thin film where tubular pores are periodically arranged is used as a translucent electrode can be obtained.

Embodiment 2

Figure 5:
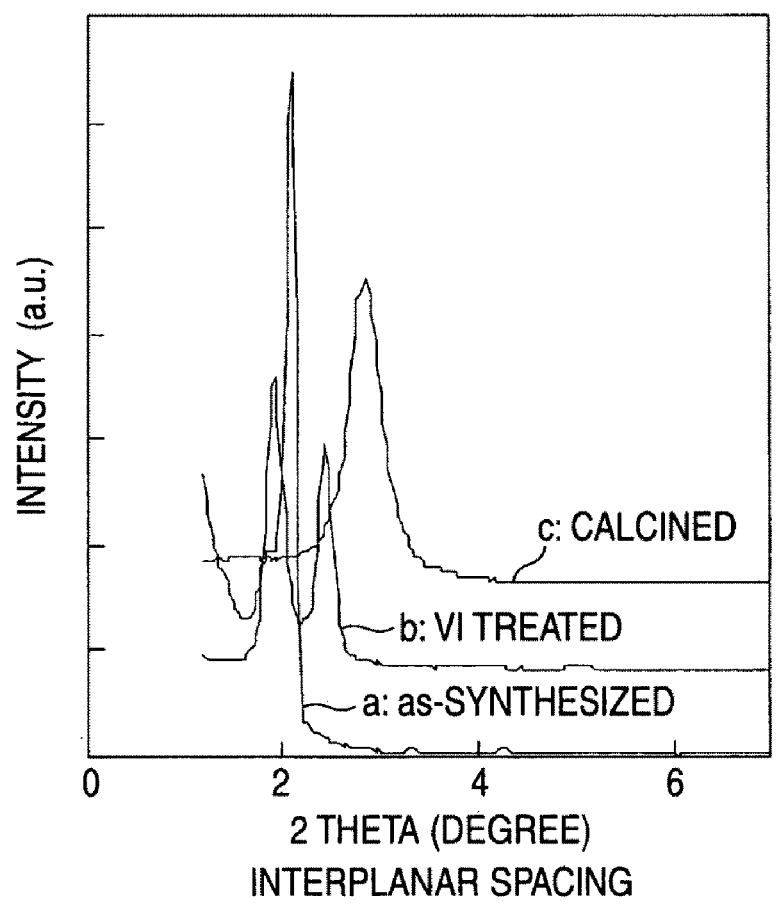
FIG. 5 is a diagram showing an interplanar spacing of a mesoporous thin film in an embodiment 2 of the invention.

In the next place, the mesoporous thin film is evaluated. In FIG. 5, XRD patterns of thin films on a silicon substrate after coating a precursor solution, applying the VI treatment with $SnCl_4$, and calcining at 723K are shown. In the drawing, a horizontal axis shows an interplanar spacing and a vertical axis shows the intensity. From the drawing, it is found that, after the coating of the precursor solution, owing to an electrostatic interaction between phosphoric acid and surfactant molecules, a hexagonal structure is formed.

Furthermore, since an interplanar spacing (d100) becomes larger after the VI treatment with $SnCl_4$, it is considered that Sn infiltrates inside of the thin film to expand an interplanar spacing of a hexagonal structure. A mechanism of forming a skeleton portion during the VI treatment, which can be considered therefrom, is obvious from FIG. 4. It is considered that, as shown in FIG. 4(a), when a micelle aggregate of the surfactant is exposed to vapor containing phosphorus P, as shown in FIG. 4(b), the phophorus P enters between micelle aggregates to expand the interplanar spacing of the micelle aggregate as shown in FIG. 4(c).

Figure 6:
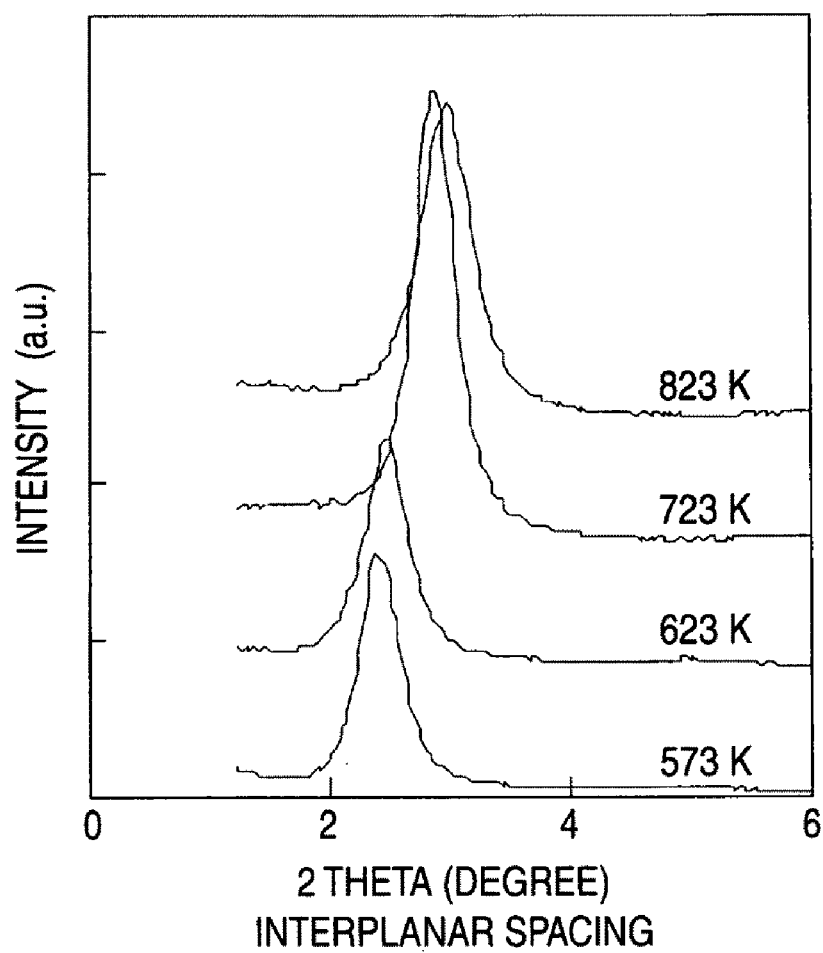
FIG. 6 is a diagram showing relationship between a calcining temperature and an interplanar spacing of a mesoporous thin film of the embodiment 2 of the invention.

Furthermore, a mesoporous thin film maintaining a periodic structure even after the calcining could be obtained (d100=3.1 nm). A TEM observation diagram of a thin film after calcining is shown in FIG. 6. In the drawing, reference signs a, b and c, respectively, show after coating, before VI treatment and after calcining. It is found that pores are arranged in parallel with page space. The interplanar spacing is 3.2 nm and substantially same as that obtained from the XRD pattern.

Figure 7:
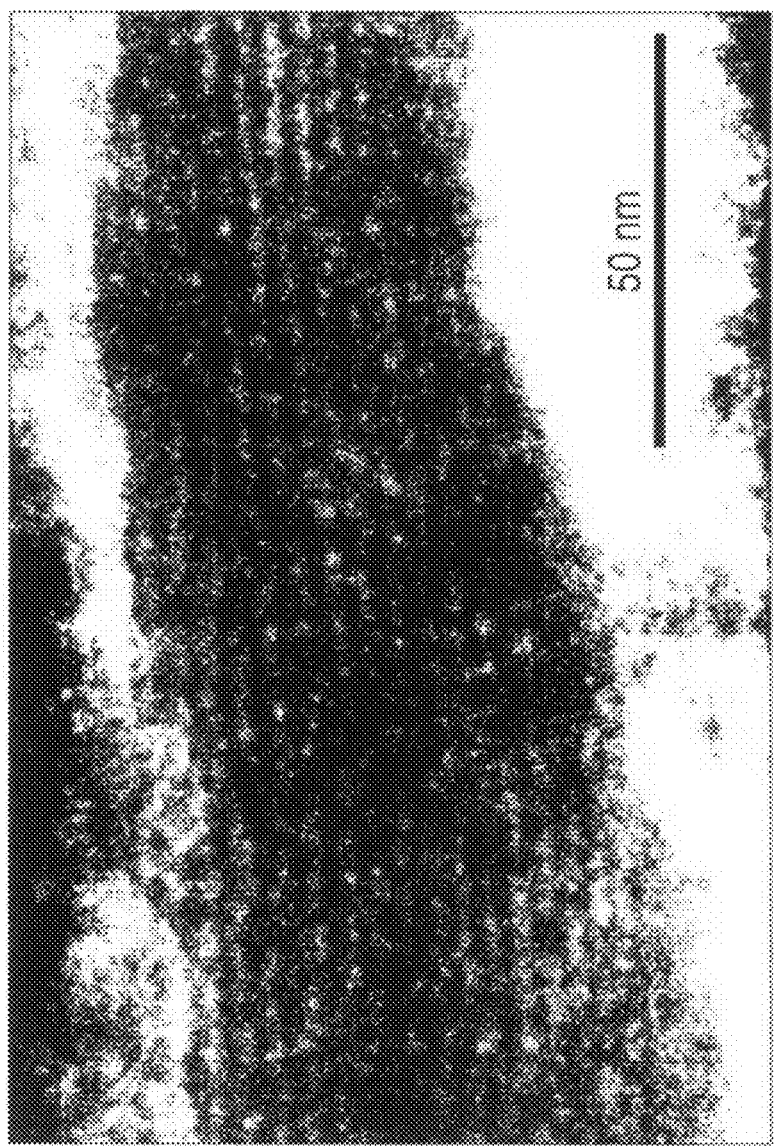
FIG. 7 is a diagram showing a mesoporous thin film in the embodiment 2 of the invention.
Figure 8:
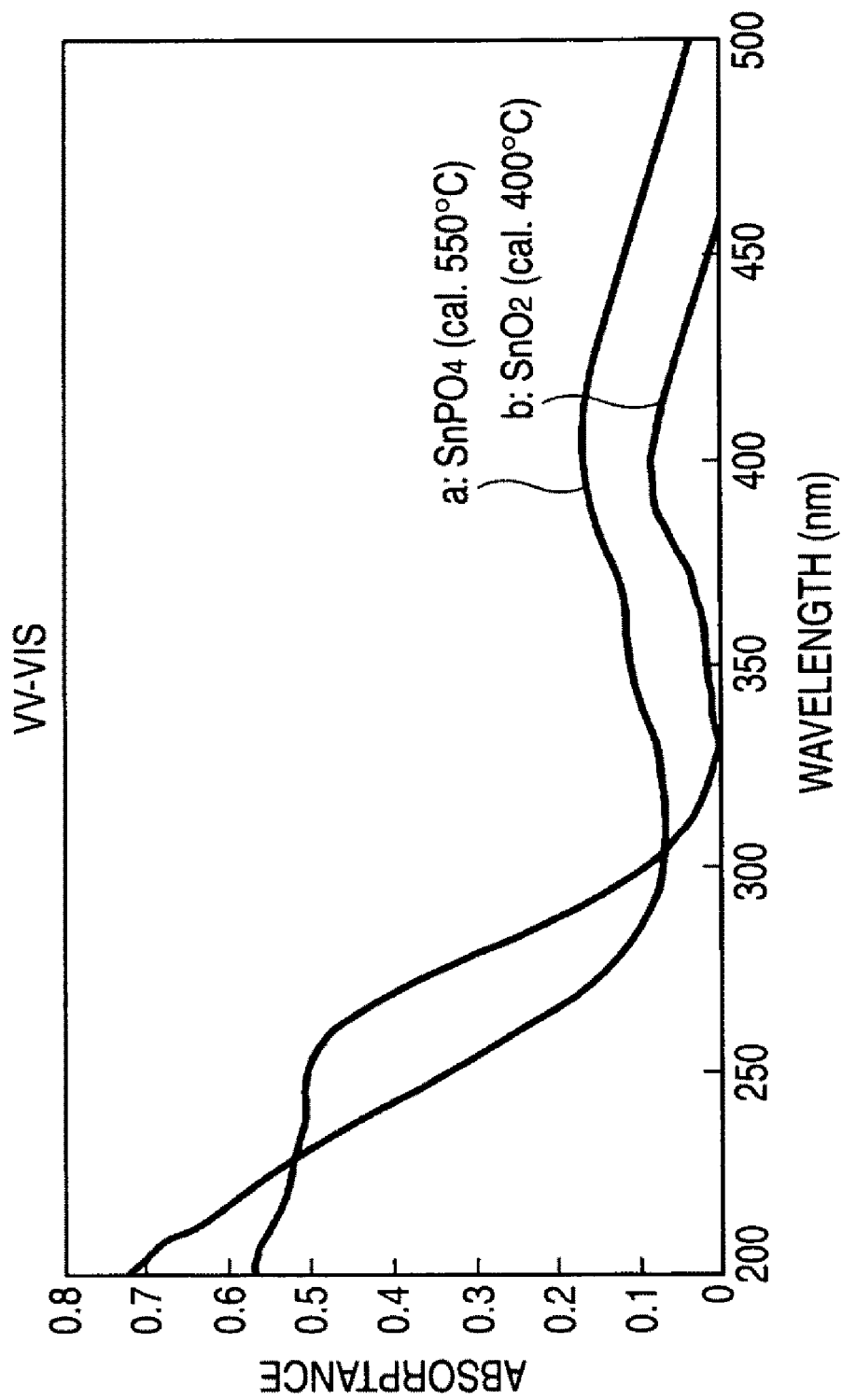
FIG. 8 is a diagram showing relationship with a wavelength of a mesoporous thin film in the embodiment 2 of the invention.

In the next place, the interplanar spacing is measured with the calcining temperature varied. In FIG. 7, XRD patterns of the thin films obtained by calcining at temperatures in the range of 573 to 823K are shown. It is found that, as the calcining temperature becomes higher, the thin film, although contracting in the interplanar spacing, maintains the periodicity and the heat resistant up to 823K. Furthermore, from EDAX measurements, it is found that in the thin film after calcining, Sn and P are present at a ratio in the range of Sn/P=36.57 to 54.91:45.09 to 63.43.

Figure 9:
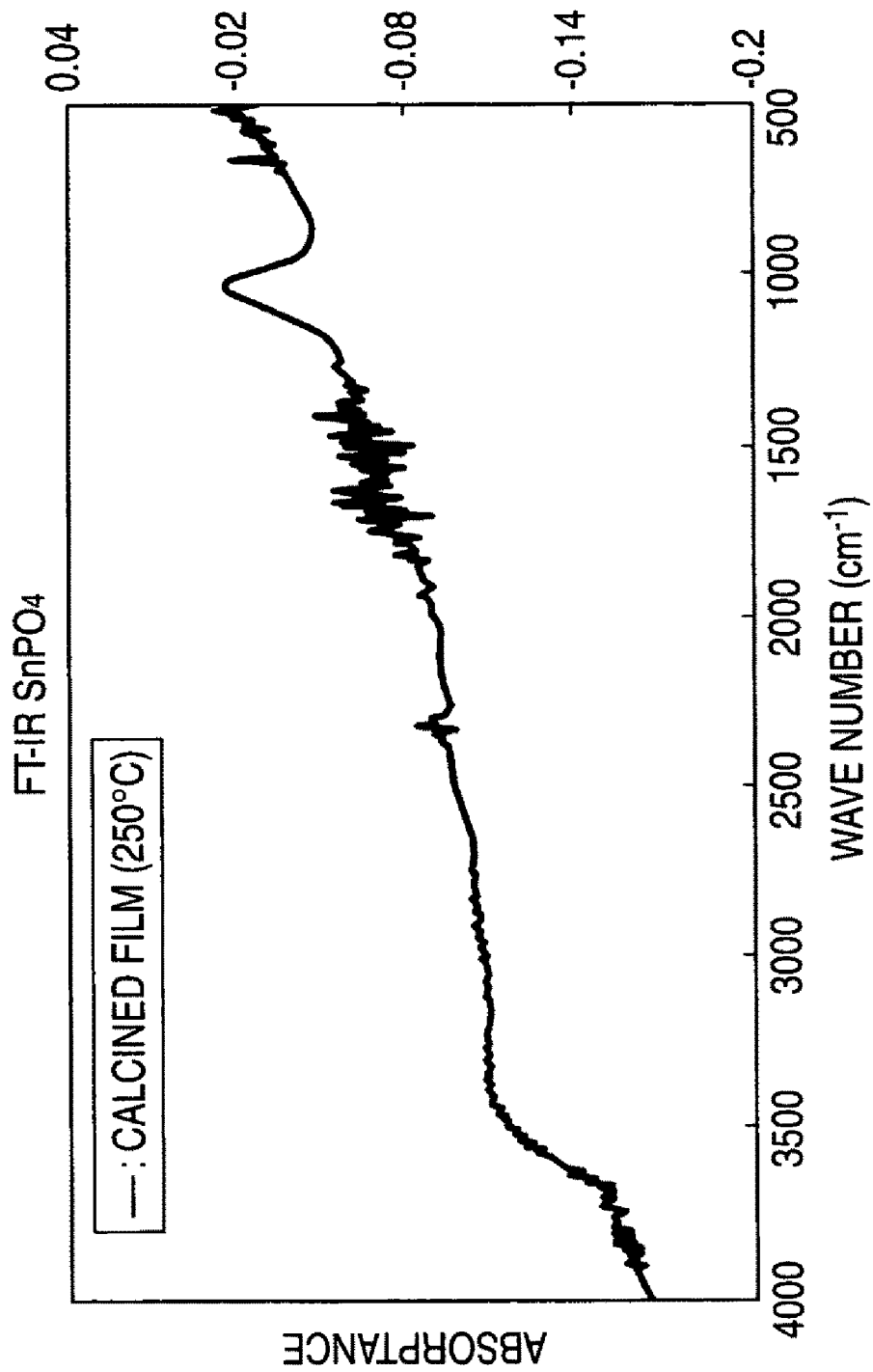
FIG. 9 is a diagram showing relationship between a wave number and the optical absorptance of a mesoporous thin film in the embodiment 2 of the invention.

Furthermore, results of measurements of the absorptance relative to wavelength are shown with a curve a. For comparison purpose, tin oxide ($SnO_2$) is shown with a curve b. From the curve, it is found that, in 300 nm or more, the thin film has very excellent translucency. Still furthermore, it is found that, in the neighborhood of 300 nm, the translucency is excellent more than tin oxide and, even over 300 nm, substantially same. Furthermore, measurement results of absorptance in an infrared region are shown in FIG. 9. In the drawing, a horizontal axis denotes the wave number and a vertical axis denotes the absorptance.

Figure 10:
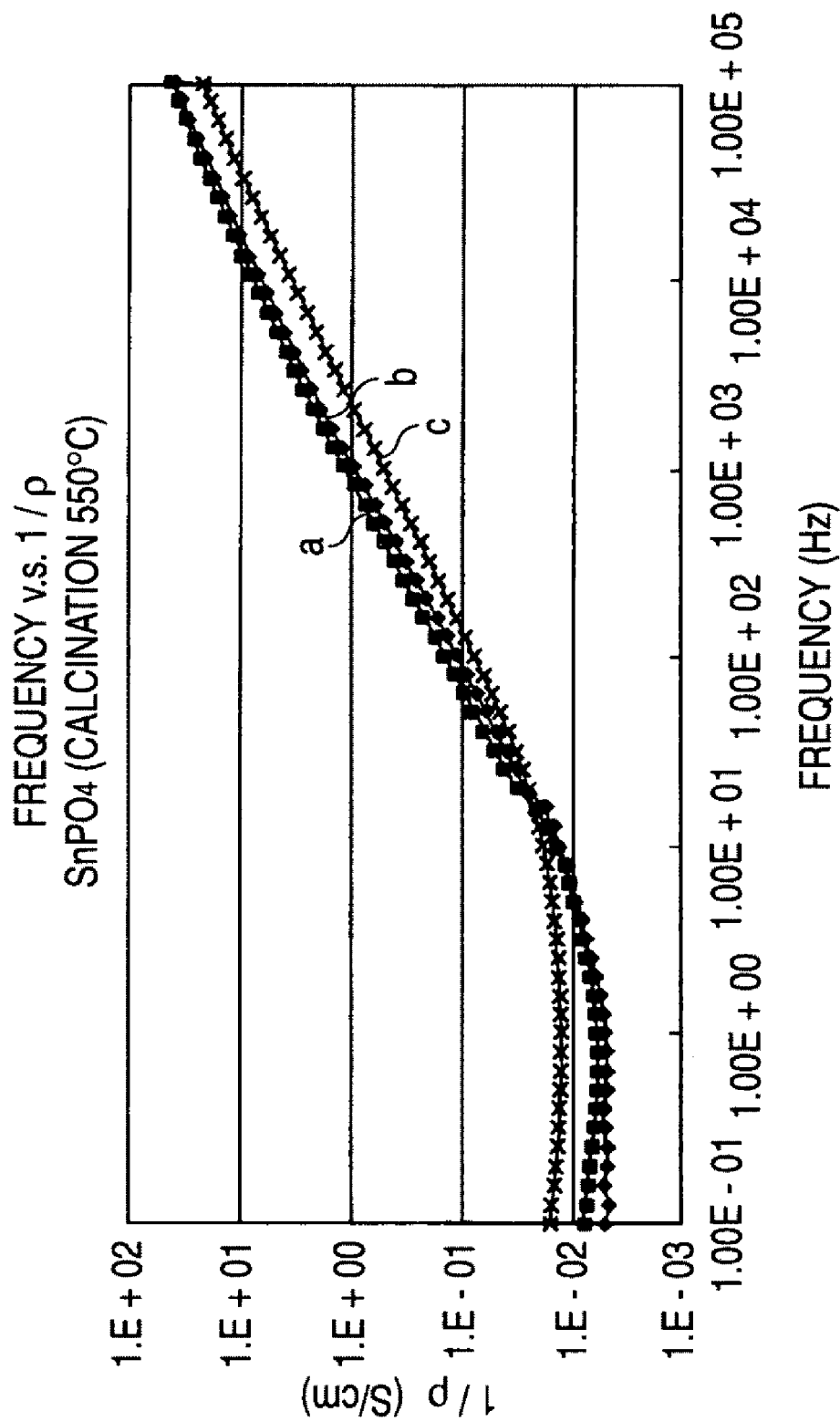
FIG. 10 is a diagram showing measurement results of high frequency characteristics of a mesoporous thin film (calcining temperature: 550° C.) in the embodiment 2 of the invention.

Measurement results of high frequency impedance characteristics of the thin film are shown in FIG. 10. From the result, it is found that the frequency characteristics are excellent. In the drawing, a vertical axis denotes inverse number of specific resistance and a vertical axis denote frequency.

Figure 11:
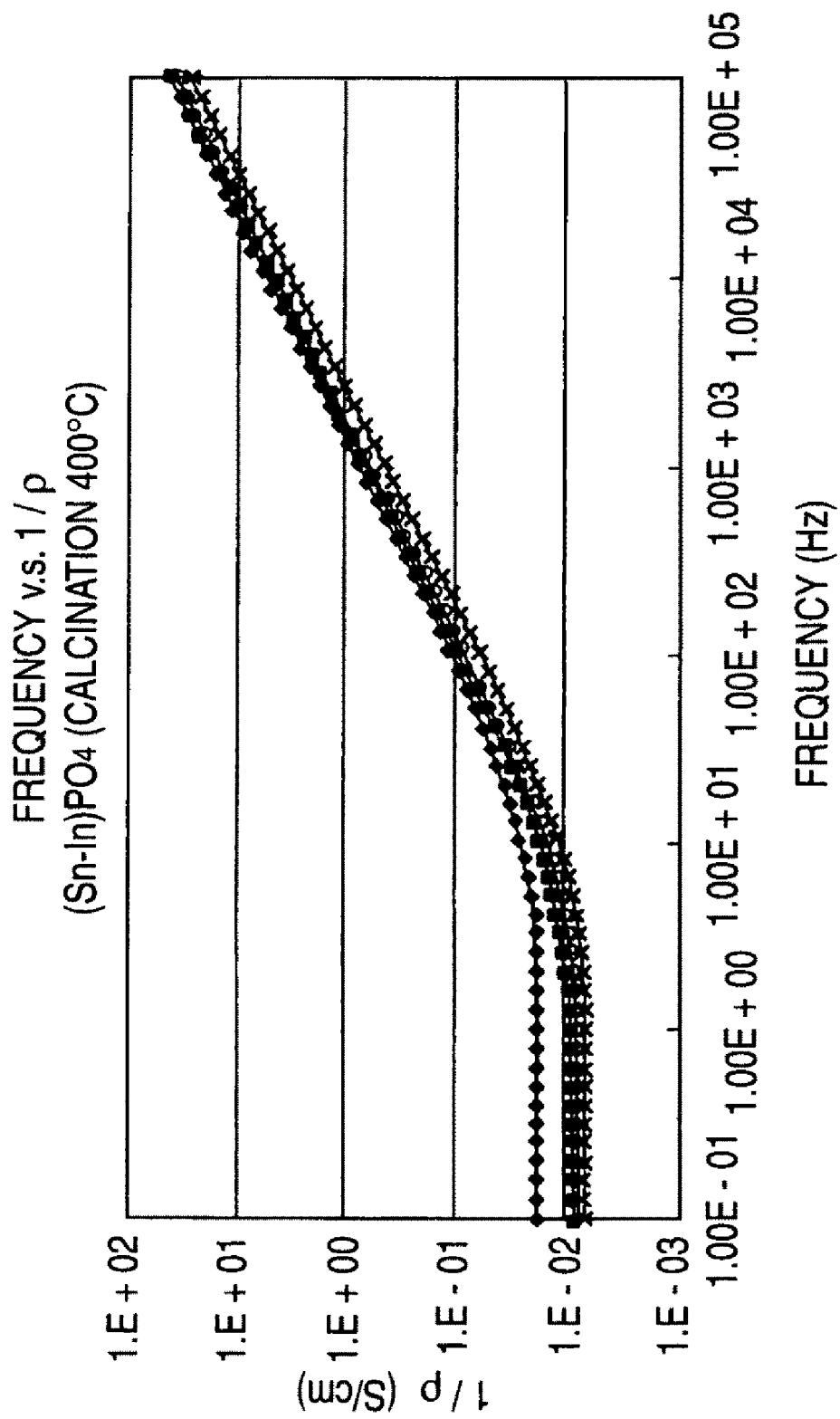
FIG. 11 is a diagram showing measurement results of high frequency characteristics of a mesoporous thin film (calcining temperature: 400° C.) in the embodiment 2 of the invention.

Furthermore, in FIG. 11, measurement results of high frequency impedance characteristics when the calcining temperature is lowered to 400° C. are shown. In this case as well, it is found that the frequency characteristics are excellent.

Embodiment 3

As a third embodiment of the invention, an example where the mesoporous thin film is applied to a gas sensor will be described.

Figure 12:
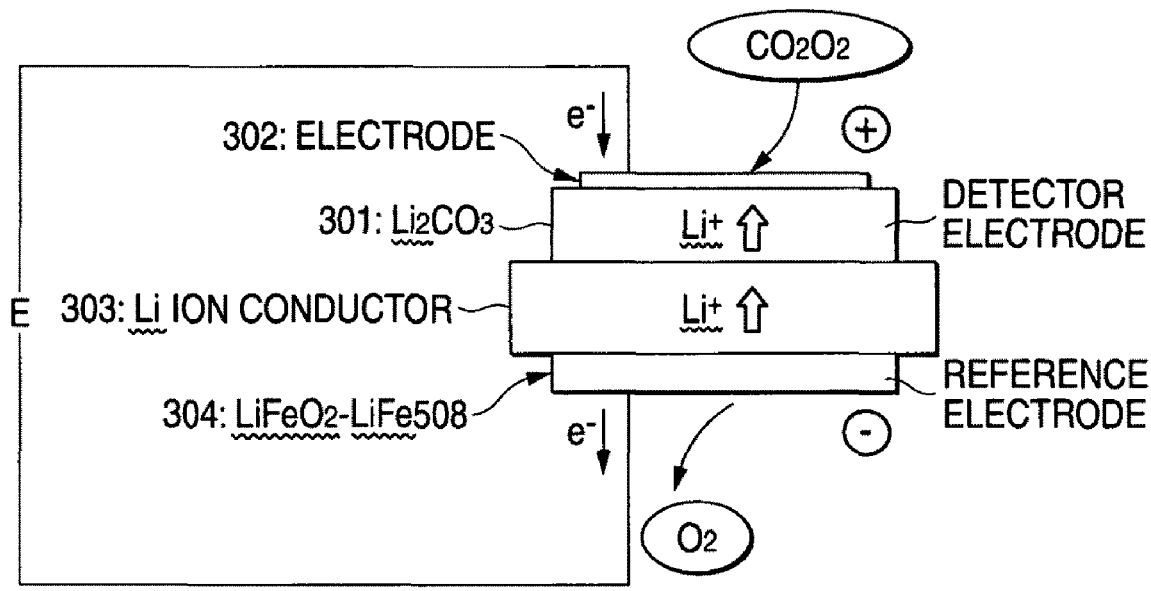
FIG. 12 is a diagram showing a gas sensor according to an embodiment 3 of the invention.

A carbon dioxide gas sensor has a configuration where, as shown in FIG. 12, as a detector electrode on a lithium carbonate 301 an electroconductive mesoporous thin film 302 is formed and has a three layer structure made of a detector electrode, a lithium ion conductor 303 and a reference electrode 304. That is, a material constituting the detector electrode is one in which on a surface of lithium carbonate that directly comes into contact with carbon dioxide to generate an electromotive force an electroconductive mesoporous thin film of the invention is laminated. Furthermore, the lithium ion conductor is made of lithium carbonate and crystallized glass and the reference electrode is made of two kinds of lithium ferrite to which gold are added.

The mesoporous thin film used in the detector electrode according to the configuration is high in the electroconductivity and porous; accordingly, a gas can efficiently permeate and tends to reach lithium carbonate that generates an electromotive force. Here, the mesoporous thin film is similarly formed as one described in the embodiment 1.

In the embodiment, as a surfactant, cationic cetyltrimethylammonium bromide (CTAB: $C_{16}H_{33}N^+(CH_3)_3Br^-$) is used. However, it goes without saying that, without restricting thereto, other surfactants may be used.

However, when an alkali ion such as sodium ion is used as a catalyst, as a semiconductor material, deterioration is caused. Accordingly, it is preferred that a cationic surfactant is used and an acid catalyst is used as a catalyst. As the acid catalyst, other than HCl, nitric acid ($HNO_3$), sulfuric acid ($H_2SO_4$), phosphoric acid ($H_3PO_4$) and the like can be used.

Furthermore, as a material that contains a metal, other than $SnCl_4$, various compounds such as $Sn_xIn_{1-x}Cl_4$, tin acetate, alkoxide of tin and so on can be used.

Still furthermore, as a solvent, although a mixed solvent of water $H_2O$/ethanol is used, water alone can be used.

Furthermore, as the calcining atmosphere, a nitrogen atmosphere is used. However, a reduced pressure atmosphere or air atmosphere may be used.

Still furthermore, a mixing ratio of the surfactant, phosphoric acid and the solvent can be appropriately varies.

Furthermore, the calcining is carried out at 400° C. for 1 hr. However, it may be in the range of 300 to 500° C. and for substantially 1 to 5 hr. Desirably, it is in the range of 350 to 450° C.

Embodiment 4

In the embodiment 1, the mesoporous thin film is formed by use of a spin coat method. However, a dip coat method may be used as well.

That is, a substrate is vertically descended to a liquid surface of the prepared precursor solution at a speed in the range of 1 mm/s to 10 m/s to submerge in the solution and left standing there for 1 s to 1 hr.

After a desired time period has passed, the substrate is vertically ascended at a speed in the range of 1 mm/s to 10 m/s to take out of the solution.

At the last, similarly to the embodiment 1, calcination is applied to completely pyrolyze and remove the surfactant, and thereby a pure mesoporous thin film is formed.

As described above, according to the invention, a porous electroconductive film high in the mechanical strength and uniform over a large area can be readily formed and the mechanical strength is high as well; accordingly, the porous electroconductive thin film can be applied as well to a solar battery cell, a gas sensor, a fuel cell electrode, a selective transmission film, a heat ray reflective film and an electroconductive film for a touch panel, which are high in the reliability.

The invention claimed is:

1. A mesoporous thin film, comprising:
    a crosslinking structure that has a metal phosphate (M-POX) skeleton, the crosslinking structure being formed so as to surround periodically arranged pores, wherein the crosslinking structure has cylindrical columnar pores that are periodically arranged along a thickness direction of the mesoporous thin film.

2. The mesoporous thin film of claim 1, wherein the metal that constitutes the crosslinking structure contains at least one of tin (Sn), indium (In), zinc (Zn) and iridium (Ir).

3. The mesoporous thin film of claim 1, wherein a film thickness of the mesoporous thin film is 10 µm or less.

4. The mesoporous thin film of claim 1, wherein the mesoporous thin film is translucent.

5. An electronic device, comprising:
    the mesoporous thin film of claim 1 as an electrode.

* * * * *